United States Patent
Lin et al.

(10) Patent No.: US 12,315,738 B2
(45) Date of Patent: May 27, 2025

(54) METHOD OF FORMING A GATE STRUCTURE INCLUDING SEMICONDUCTOR MATERIAL IMPLANTATION INTO DUMMY GATE STACK

(71) Applicant: Taiwan Semiconductor Manufacturing Co., Ltd., Hsinchu (TW)

(72) Inventors: Shih-Hao Lin, Hsinchu (TW); Jui-Lin Chen, Taipei (TW); Hsin-Wen Su, Hsinchu (TW); Kian-Long Lim, Hsinchu (TW); Bwo-Ning Chen, Keelung (TW); Chih-Hsuan Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/741,998

(22) Filed: Jun. 13, 2024

(65) Prior Publication Data
US 2024/0332089 A1    Oct. 3, 2024

Related U.S. Application Data

(63) Continuation of application No. 17/877,221, filed on Jul. 29, 2022, now Pat. No. 12,027,425, which is a
(Continued)

(51) Int. Cl.
*H01L 21/3115* (2006.01)
*H01L 21/02* (2006.01)
(Continued)

(52) U.S. Cl.
CPC .. *H01L 21/31155* (2013.01); *H01L 21/02532* (2013.01); *H01L 21/0259* (2013.01);
(Continued)

(58) Field of Classification Search
CPC .......... H01L 21/02532; H01L 21/0259; H01L 21/31155; H01L 21/76825; H01L 21/76828; H01L 29/66545; H01L 29/6656; H01L 29/66636; H01L 29/66742; H01L 29/78; H01L 29/7843; H01L 29/7848; H01L 29/78618; H01L 29/78696; H10D 30/01; H10D 30/017;
(Continued)

(56) References Cited

U.S. PATENT DOCUMENTS

| 2008/0026517 A1 | 1/2008 | Grudowski |
| 2008/0145978 A1 | 6/2008 | Laxman |

(Continued)

*Primary Examiner* — Cheung Lee
(74) *Attorney, Agent, or Firm* — HAYNES AND BOONE, LLP

(57) ABSTRACT

Methods of forming a semiconductor device are provided. A method according to the present disclosure includes forming, over a workpiece, a dummy gate stack comprising a first semiconductor material, depositing a first dielectric layer over the dummy gate stack using a first process, implanting the workpiece with a second semiconductor material different from the first semiconductor material, annealing the dummy gate stack after the implanting, and replacing the dummy gate stack with a metal gate stack.

20 Claims, 13 Drawing Sheets

Related U.S. Application Data continuation of application No. 16/931,717, filed on Jul. 17, 2020, now Pat. No. 11,482,610.

(60) Provisional application No. 62/906,158, filed on Sep. 26, 2019.

(51) Int. Cl.
*H10D 30/01* (2025.01)
*H10D 30/67* (2025.01)
*H10D 30/69* (2025.01)
*H10D 62/00* (2025.01)
*H10D 62/10* (2025.01)
*H10D 64/01* (2025.01)
*H10D 84/01* (2025.01)
*H10D 84/03* (2025.01)

(52) U.S. Cl.
CPC ......... *H10D 30/024* (2025.01); *H10D 30/031* (2025.01); *H10D 30/6713* (2025.01); *H10D 30/6735* (2025.01); *H10D 30/6757* (2025.01); *H10D 30/792* (2025.01); *H10D 62/021* (2025.01); *H10D 62/118* (2025.01); *H10D 64/017* (2025.01); *H10D 64/018* (2025.01); *H10D 64/021* (2025.01); *H10D 84/0147* (2025.01); *H10D 84/038* (2025.01)

(58) Field of Classification Search
CPC ..... H10D 30/019–0198; H10D 30/024; H10D 30/0273; H10D 30/031; H10D 30/0312; H10D 30/0318; H10D 30/501–509; H10D 30/6713; H10D 30/6735; H10D 30/674; H10D 30/6757; H10D 30/792; H10D 30/83; H10D 48/074; H10D 62/021; H10D 62/118; H10D 64/017; H10D 64/018; H10D 64/021; H10D 64/252; H10D 64/2523; H10D 64/2527; H10D 84/01; H10D 84/0147; H10D 84/038; H10D 84/903
See application file for complete search history.

(56) References Cited

U.S. PATENT DOCUMENTS

| | | |
|---|---|---|
| 2015/0093871 A1 | 4/2015 | Li |
| 2016/0111537 A1 | 4/2016 | Tsai |
| 2018/0061959 A1 | 3/2018 | Liu |

METHOD OF FORMING A GATE STRUCTURE INCLUDING SEMICONDUCTOR MATERIAL IMPLANTATION INTO DUMMY GATE STACK

PRIORITY DATA

This application is a continuation of U.S. patent application Ser. No. 17/877,221, filed Jul. 29, 2022, which is a continuation of U.S. patent application Ser. No. 16/931,717, filed Jul. 17, 2020, which claims priority to U.S. Provisional Patent Application Ser. No. 62/906,158, filed on Sep. 26, 2019, each of which is hereby incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As geometry size of IC devices continues to shrink, it becomes more and more challenging to form features of the desirable shape. For example, in gate-last processes, a dummy gate stack is first formed as a placeholder for a later-formed metal gate stack to undergo a substantial portion of the fabrication processes and then the dummy gate stack is removed and replaced with the functional metal gate stack. To replace the dummy gate stack, the dummy gate stack is first removed to form a gate trench and then a plurality of layers is deposited in the gate trench to form the functional metal gate stack. In some instances, the dummy gate stack does not have straight sidewalls and instead, has a necking profile. Such a necking profile of the dummy gate stack may result in a corresponding necking profile in the gate trench. The necking profile in the gate trench may present challenges for the deposition of the plurality of layer to form the metal gate stack. Therefore, while the conventional gate-last processes are adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
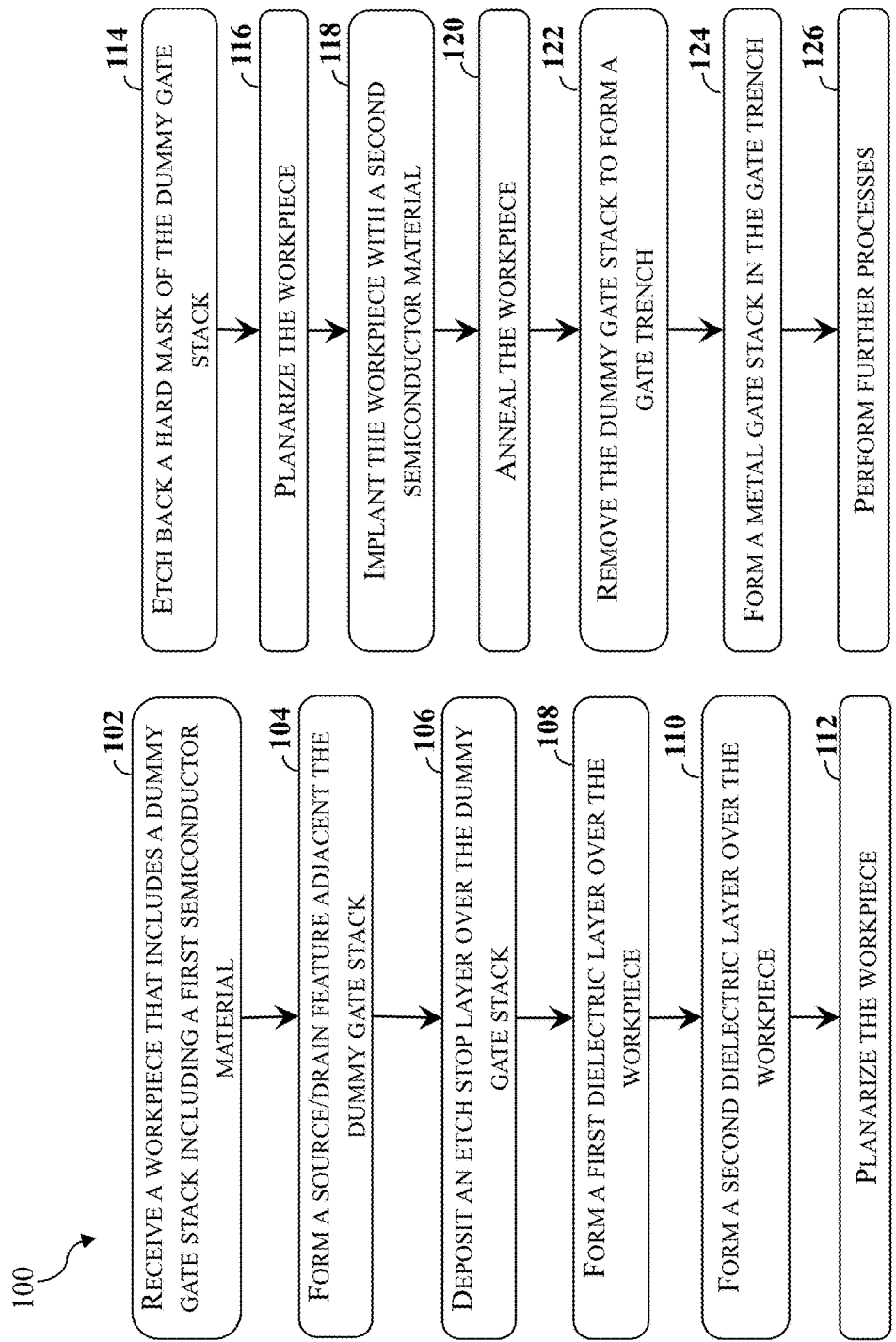
FIG. 1 illustrates a flowchart of a method of forming a semiconductor device, according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal gate stacks, which are commonplace in modern-day transistors, may be formed using a gate-first process or a gate-last process. In the former, the functional metal gate stack is formed before formation of several features, such as source/drain features and an interlayer dielectric layer. In the latter, a non-functional dummy gate stack is first formed as a placeholder for a later-formed metal gate stack to undergo fabrication processes for the source/drain feature and the interlayer dielectric layer and then the dummy gate stack is removed and replaced with the functional metal gate stack. To replace the dummy gate stack, the dummy gate stack is first removed to form a gate trench and then a plurality of layers is deposited in the gate trench to form the functional metal gate stack. In some instances, the dummy gate stack does not have straight sidewalls and instead, has a necking profile with a reduced width. Such a necking profile of the dummy gate stack may result in a corresponding necking profile in the gate trench after the dummy gate stack is removed. The necking profile in the gate trench may present challenges for the deposition of the plurality of layer to form the metal gate stack. For example, before deposition of all the plurality of layers in the gate trench, a layer may merge and close the opening of the trench, preventing deposition of subsequent layers in the gate trench.

To address the foregoing problems, the present disclosure provides a method of forming a semiconductor device. In some embodiments of the present disclosure, the method includes implanting a dummy gate stack with a semiconductor material other than silicon, such as germanium. In some implementations, the implanted semiconductor material may include germanium. When the dummy gate stack includes a narrow necking portion, the implantation may render a concentrated doped portion near a necking portion, causing a tensile stress in the necking portion of the dummy gate to push outward. The method may further include an anneal process. During the anneal process, the implanted necking portion is subject to a tensile stress and the undoped portion of the dummy gate crystallizes and is under influence of a compressive stress. Operations of the tensile stress and the compressive stress may reduce extent of the necking, resulting in a dummy gate stack with upright sidewalls. The dummy gate stack with upright sidewalls may lead to upright sidewalls of a gate trench for formation of a metal gate stack.

FIG. 1 illustrates a flow chart of a method 100 for forming a semiconductor device according to various aspects of the present disclosure. FIGS. 2-13 are fragmentary cross-sectional views of a workpiece at various stages of fabrication of the method 100 in FIG. 1. Additional steps can be provided before, during, and after method 100, and some of the steps described can be moved, replaced, or eliminated for additional embodiments of method 100. Additional features can be added in the contact structure depicted in FIGS. 2-13, and some of the features described below can be replaced, modified, or eliminated in other embodiments of the interconnect structure depicted in FIGS. 2-13.

Figure 2:
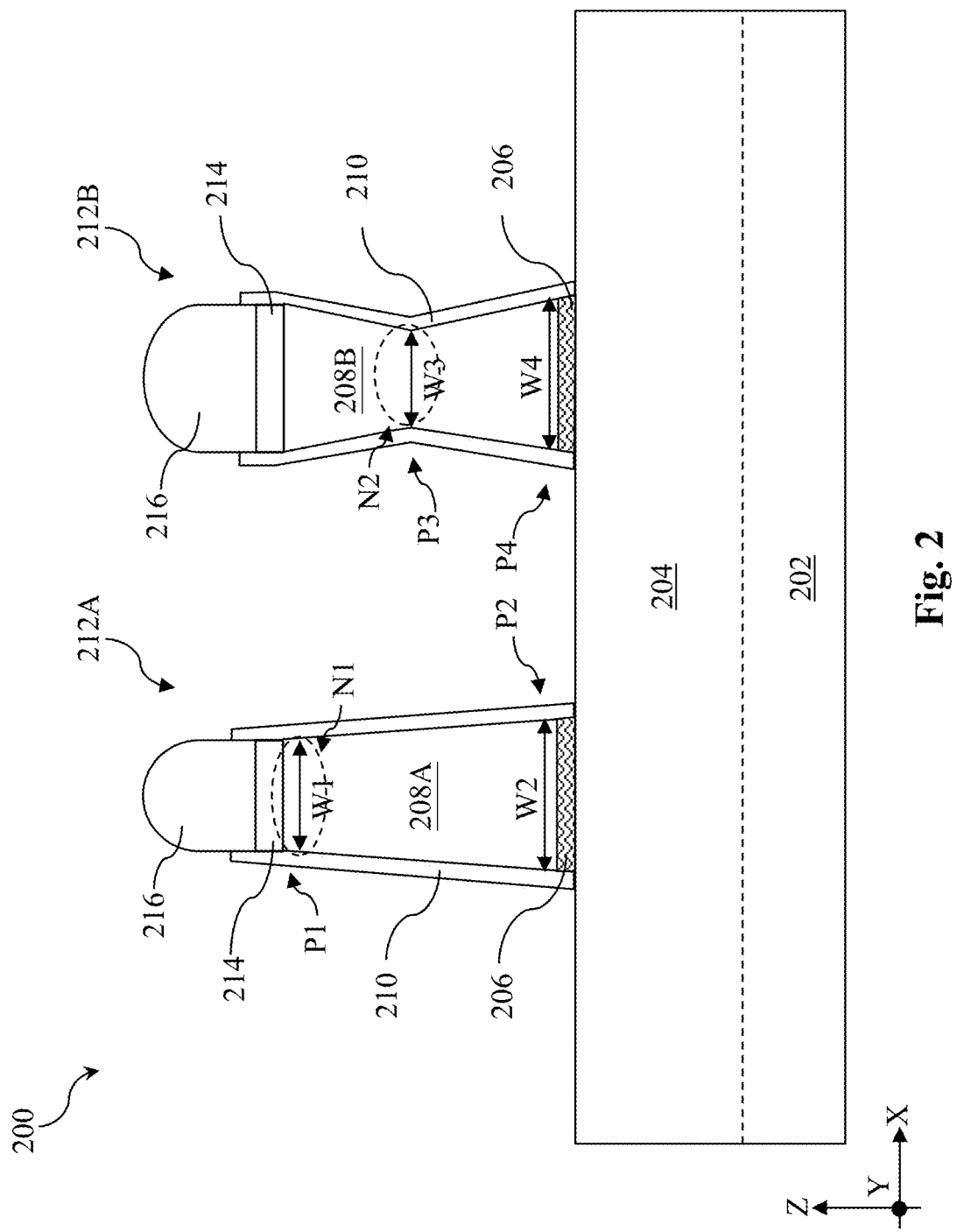
FIGS. 2-13 are fragmentary cross-sectional views of a workpiece during various operations of the method of FIG. 1, according to aspects of the present disclosure.

Referring to FIGS. 1 and 2, the method 100 includes a block 102 where a workpiece 200 is received. The workpiece 200 includes a first dummy gate stack 212A and a second dummy gate stack 212B formed of a first semiconductor material. Upon conclusion of the method 100, the workpiece 200 may be fabricated into a semiconductor device 200. In that sense, the workpiece 200 may also be referred to as a semiconductor device 200 in suitable context. The semiconductor device 200 can be included in a microprocessor, a memory, and/or other IC device. In some implementations, the semiconductor device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) or gate-all-around (GAA) transistors.

As illustrated in FIG. 2, the semiconductor device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Semiconductor device 200 includes an active region 204 over substrate 202. The active region 204 may be a fin-shape semiconductor feature, or a vertical stack of nanostructures. In FIGS. 2-13, the active region 204 horizontally extends along the X-direction over the substrate 202 and extends vertically along the Z-direction from the substrate 202. In some implementations, the active region 204 may be a portion of substrate 202 (such as a portion of a material layer of substrate 202). For example, silicon active region 204 may be formed from silicon substrate 202. Alternatively, in some implementations, the active region 204 is defined in a material layer, such as one or more semiconductor material layers formed over substrate 202. For example, the active region 204 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

The active region 204 may be formed over substrate 202 by any suitable process. In some implementations, a combination of deposition, lithography and/or etching processes are performed to define the active region 204 illustrated in FIG. 2. For example, forming the active region 204 includes performing a lithography process to form a patterned resist layer over substrate 202 (or a material layer, such as a heterostructure, disposed over substrate 202) and performing an etching process to transfer a pattern defined in the patterned resist layer to substrate 202 (or the material layer, such as the heterostructure, disposed over substrate 202). The lithography process can include forming a resist layer on substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 202 (or a material layer disposed over substrate 202). The etching process can include a dry etching process (for example, a reactive ion etching (RIE) process), a wet etching process, other suitable etching process, or combinations thereof. After the etching process, the patterned resist layer is removed from substrate 202, for example, by a resist stripping process. Alternatively, the active region 204 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming the active region 204. Further, in some implementations, the exposure process can implement maskless lithography, electron-beam (e-beam) writing, ion-beam writing, and/or nanoimprint technology for patterning the resist layer and/or other layers.

An isolation feature (not shown) is formed over and/or in substrate 202 to isolate various regions, such as various device regions, of the semiconductor device 200. For example, the isolation feature separates and isolates the active region 204 from an adjacent active region. In some embodiment, the isolation feature may surround a bottom portion of the active region 204 and expose a top portion of the active region 204. The isolation feature may include silicon oxide, silicon nitride, silicon oxynitride, other suitable isolation material (for example, including silicon, oxygen, nitrogen, carbon, or other suitable isolation constituent), or combinations thereof. The isolation feature can include different structures, such as shallow trench isolation (STI) structures, deep trench isolation (DTI) structures, and/or local oxidation of silicon (LOCOS) structures. In some implementations, STI features can be formed by etching a trench in substrate 202 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature. In some implementations, STI features can be formed by depositing an insulator material over substrate 202 after forming the active region 204 (in some implementations, such that the insulator material layer fills gaps (trenches) between the active region 204 and an adjacent active region) and etching back the insulator material layer to form isolation feature. In some implementations, the isolation feature includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide).

In embodiments illustrated in FIG. 2, the workpiece 200 includes a first dummy gate stack 212A and a second dummy gate stack 212B disposed over and around channel regions in the active region 204. Each of the first dummy gate stack 212A and the second dummy gate stack 212B may include a dummy gate dielectric layer, a dummy electrode, and one or more gate-top hard masks. In the embodiments represented in FIG. 2, the first dummy gate stack 212A includes a dummy gate dielectric layer 206 over the active region 204, a first dummy gate electrode 208A over the dummy gate dielectric layer 206, a first gate-top hard mask 214, and a second gate-top hard mask 216. Similarly, the second dummy gate stack 212B includes the dummy gate dielectric layer 206, a second dummy gate electrode 208B over the dummy gate dielectric layer 206, the first gate-top hard mask 214, and the second gate-top hard mask 216. In some implementations, the dummy gate dielectric layer 206 may be formed of silicon oxide; and the first dummy gate electrode 208A and the second dummy gate electrode 208B may be formed of polysilicon. In some instances, the first gate-top hard mask 214 and the second gate-top hard mask 216 may have different compositions. In one embodiment, the first gate-top hard mask 214 may be formed of silicon oxide and the second gate-top hard mask 216 may be formed of silicon nitride. The gate spacer layer 210 may be formed along sidewalls of the first dummy gate stack 212A and the second dummy gate stack 212B by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over workpiece 200 and subsequently anisotropically etched to form the gate spacer layer 210. In some implementations, the gate spacer layer 210 may include a multi-layer structure, such as a first spacer layer that includes silicon nitride and a second spacer layer that includes silicon oxide. In some implementations, the gate spacer layer 210 may include more than one set of spacers, such as seal spacers, offset spacers, sacrificial spacers, dummy spacers, and/or main spacers, formed adjacent to the gate stacks. It is noted that the cross-sectional view in FIG. 2 depicts a cross section that cut across a top surface of the active region 204 along the X-direction. For example, when the active region 204 is a fin-shape active region (or a fin), the first dummy gate stack 212A and the second dummy gate stack 212B in FIG. 2 are shown to be disposed on a top surface of the fin.

Due to process variations, dummy gate stacks may not have perfectly straight/upright sidewalls. Two non-ideal profiles of dummy gate stacks are selected and illustrated in FIG. 2 to describe embodiments of the present disclosure. As shown in FIG. 2, the first dummy gate stack 212A is tapered away from the substrate 202 and includes an upper portion P1 away from the active region 204 and a lower portion P2 adjacent the active region 204. The upper portion P1 includes a first width W1 and the lower portion P2 includes a second width W2. W2 is greater than W1 by a first difference (D1). The reduction of width in the upper portion P1 may be referred to as a first necking portion N1. Different from the first dummy gate stack 212A, the second dummy gate stack 212B includes a reduced mid portion P3 and a lower portion P4. The mid portion P3 of the second dummy gate stack 212B includes a third width W3 and the lower portion P4 of the second dummy gate stack 212B includes a fourth width W4. W4 is greater than W3 by a second different (D2). The reduction of width in the mid portion P3 may be referred to as a second necking portion N2. In a gate replacement process, the first necking portion N1 and the second necking portion N2 may translate into reduced openings that hinder deposition of layers in metal gate stacks. In embodiments where the later-formed metal gate stack includes a titanium aluminum (TiAl) work function layer, the first necking portion N1 and the second necking portion N2 may lead to imperfect filling or voids in the metal gate stack, resulting in undesirable increase in threshold voltage.

Figure 3:
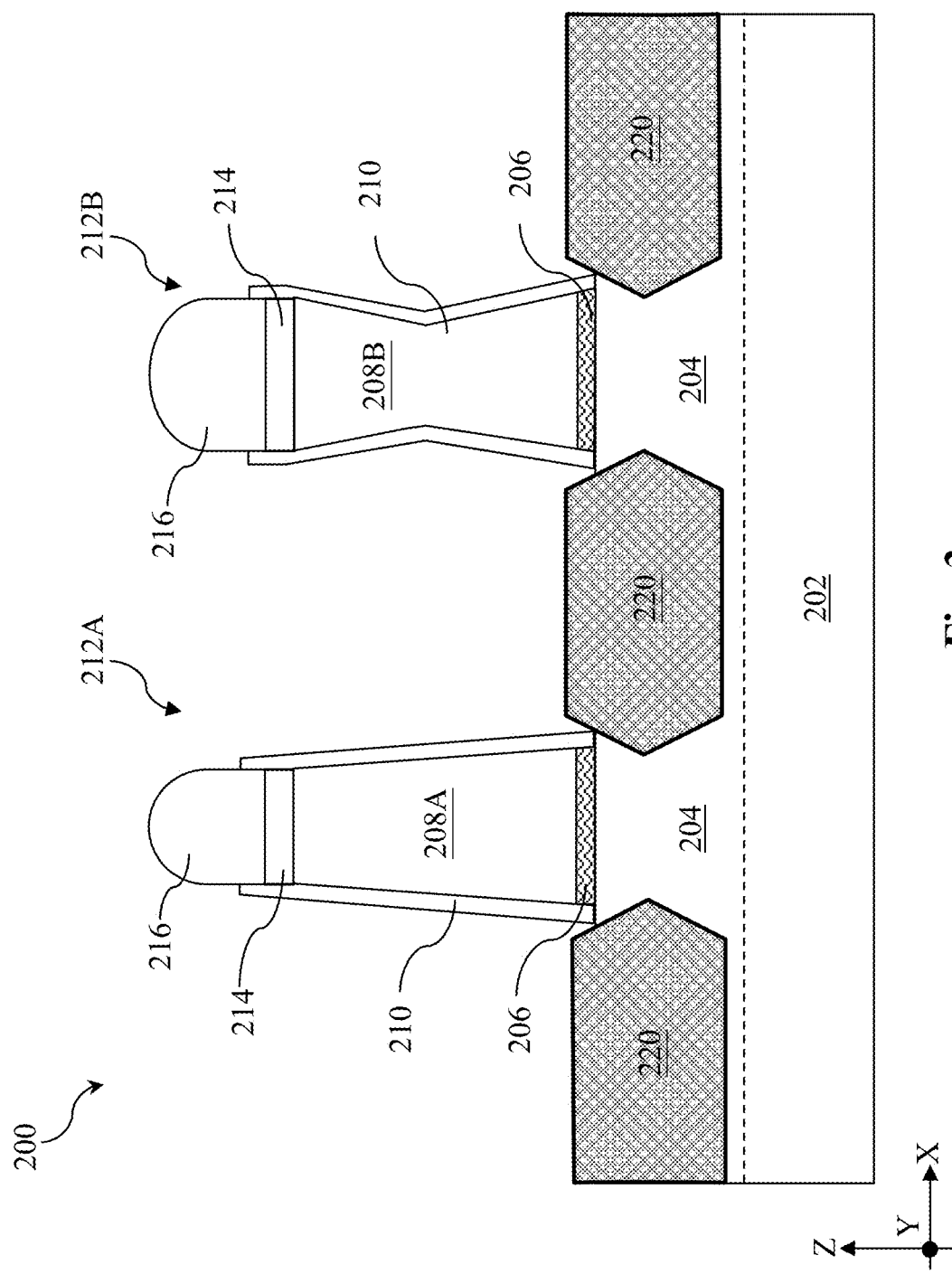

Referring to FIGS. 1 and 3, the method 100 includes a block 104 where a source/drain feature 220 is formed adjacent the first dummy gate stack 212A and the second dummy gate stack 212B. Source/drain features 220 may be disposed in source/drain regions of the active region 204. In some implementations, source/drain features 220 are formed over source/drain regions of the active region 204 using an epitaxy process. The epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Source/drain features 220 may be doped with n-type dopants and/or p-type dopants. In some implementations, where the transistor is configured as an n-type device (for example, having an n-channel), source/drain features 220 can be silicon-containing epitaxial layers or silicon-carbon-containing epitaxial layers doped with phosphorous, other n-type dopant, or combinations thereof (for example, forming Si: P epitaxial layers or Si: C: P epitaxial layers). In some implementations, where the transistor is configured as a p-type device (for example, having a p-channel), source/drain features 220 can be silicon-and-germanium-containing epitaxial layers doped with boron, other p-type dopant, or combinations thereof (for example, forming Si: Ge: B epitaxial layers). In some implementations, annealing processes are performed to activate dopants in source/drain features 220 of the semiconductor device 200.

In some embodiments, in order to prevent thermal diffusion of the p-type or n-type dopants from the source/drain features 220 during a subsequent anneal process 400 at block 120 (described below), the source/drain feature 220 is doped with carbon. In some implementations, the source/drain feature 220 may include a first epitaxial layer (not shown) and a second epitaxial layer over the first epitaxial layer. The second epitaxial layer may include a higher n-type/p-type dopant concentration than that of the underlying first epitaxial layer such that the contact resistance may be lowered. In those implementations, the first epitaxial layer may be doped with carbon while the second epitaxial layer is not intentionally doped with carbon. The carbon-doped first epitaxial layer may prevent thermal diffusion of n-type/p-type dopants from the heavily doped second epitaxial layer into the underlying first epitaxial layer.

Figure 4:
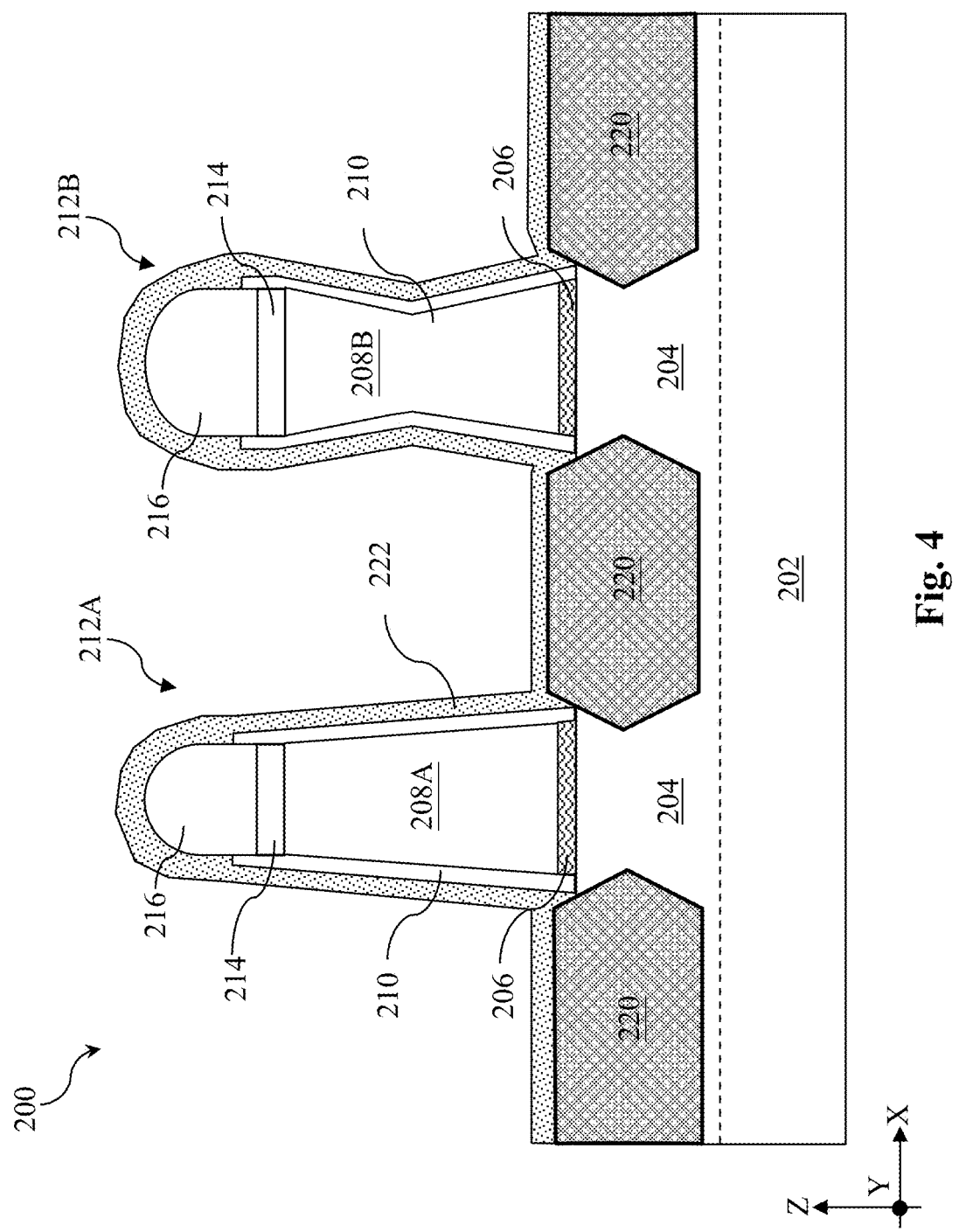

Referring to FIGS. 1 and 4, the method 100 includes a block 106 where an etch stop layer 222 is deposited over the first dummy gate stack 212A and the second dummy gate stack 212B. In some embodiments, the etch stop layer 222 may be formed of silicon nitride or silicon carbonitride and may be conformally deposited using atomic layer deposition (ALD).

Figure 5:
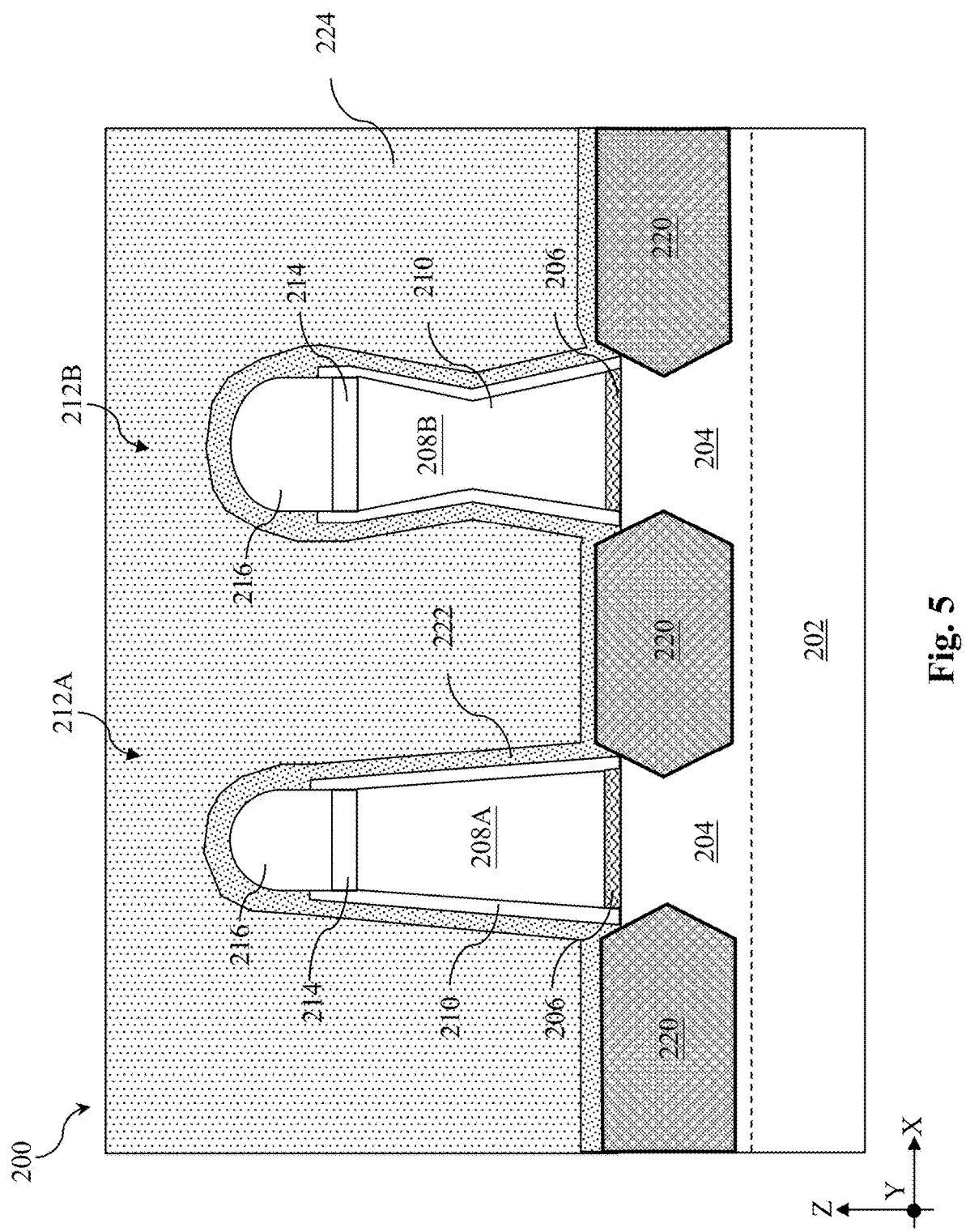

Referring to FIGS. 1 and 5, the method 100 includes a block 108 where a first dielectric layer 224 is deposited over the workpiece 200. In some embodiments, the first dielectric layer 224 may be formed using a flowable chemical vapor deposition (FCVD) process. In some implementations, after deposition using a FCVD process, the deposited first dielectric layer 224 may be cured by incidence of ultraviolet (UV) radiation, annealing, or both. In some embodiments, the first dielectric layer 224 may include a dielectric material including, for example, silicon oxide, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Acrogel, amorphous fluorinated carbon, Parylene, BCB, SILK (Dow Chemical, Midland, Michigan), polyimide, other low-k dielectric material, or combinations thereof.

Figure 6:
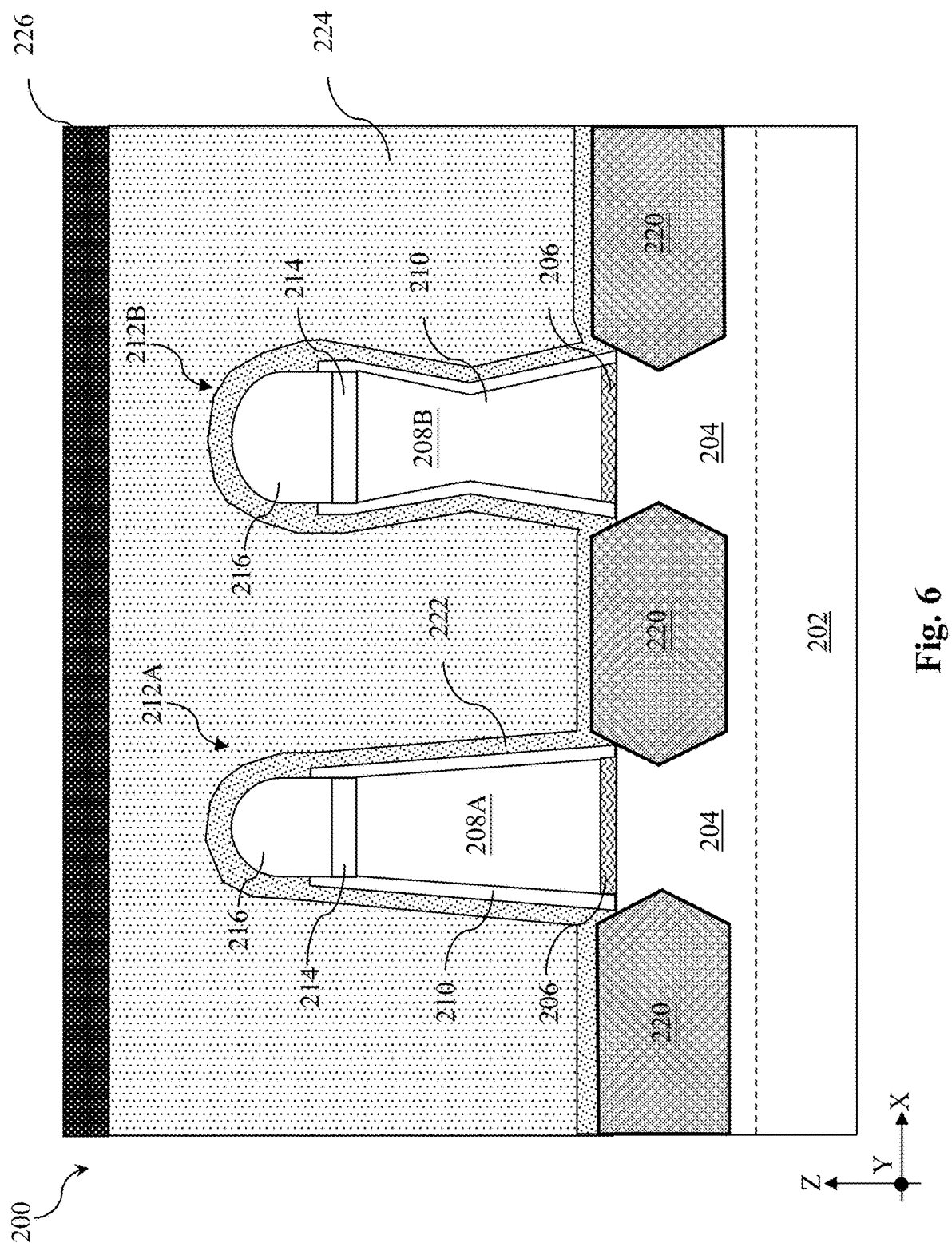

Referring to FIGS. 1 and 6, the method 100 includes a block 110 where a second dielectric layer 226 is deposited over the workpiece 200. In some embodiments, the second dielectric layer 226 includes silicon oxide and may be formed using a process different from the process used to form the first dielectric layer 224 at block 108. In some instances, the second dielectric layer 226 may be deposited using a plasma-enhanced chemical vapor deposition (PECVD) process. As compared to the first dielectric layer 224, the second dielectric layer 226 formed using PECVD is more uniform and denser and functions to provide control to the subsequent planarization process at block 112.

Figure 7:
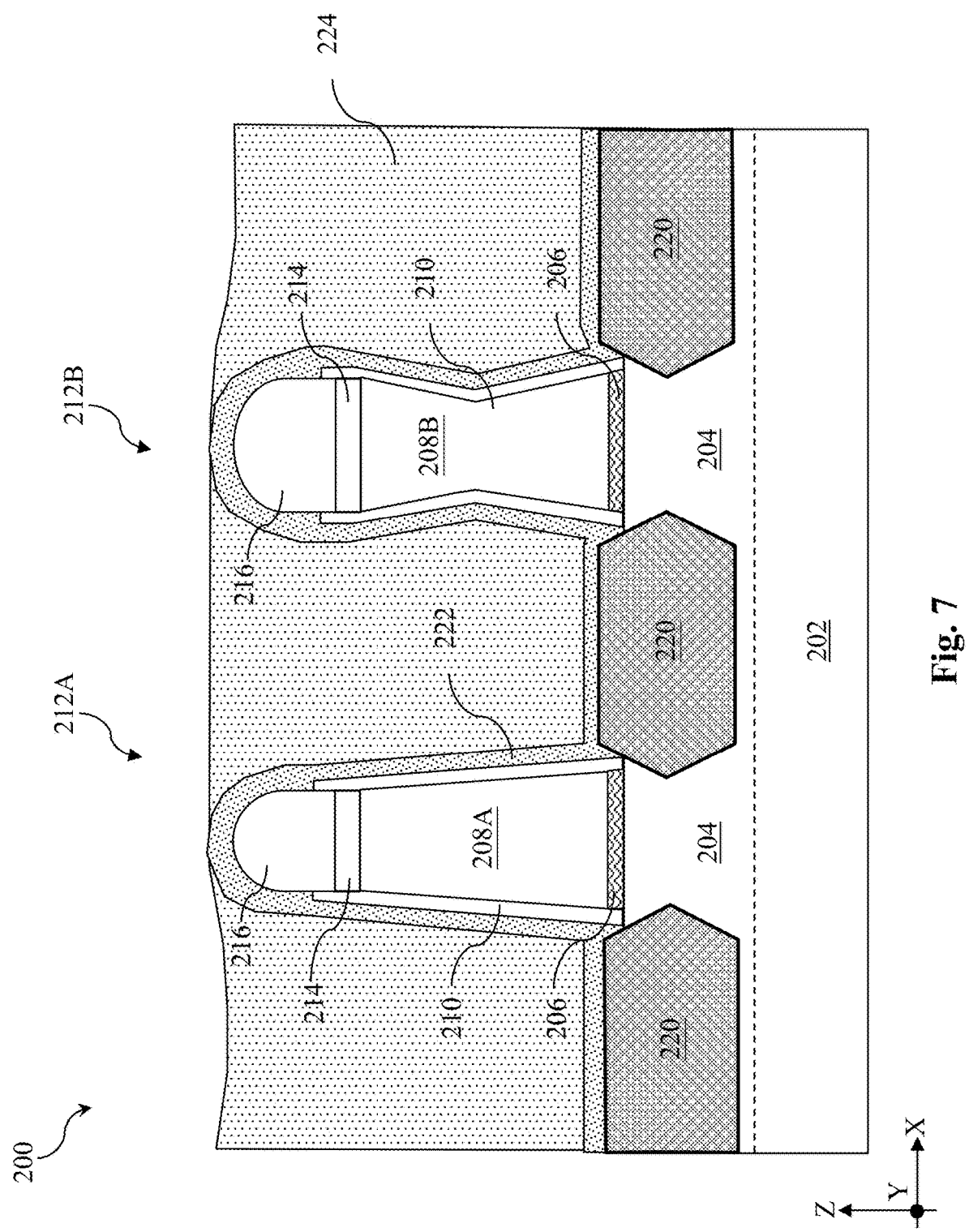

Referring to FIGS. 1 and 7, the method 100 includes a block 112 where the workpiece 200 is planarized. In some embodiments, the workpiece 200 is planarized by a chemical mechanical polishing (CMP) process. As illustrated in FIG. 7, the planarization at block 112 may completely remove the second dielectric layer 226 and reduce a thickness of the first dielectric layer 224. Although not shown, an anneal process may be performed to the workpiece 200 after the planarization at block 112. It is observed that the anneal process may repair the top surface of the planarized first dielectric layer 224 that may be damaged by the planarization operations at block 112.

Figure 8:
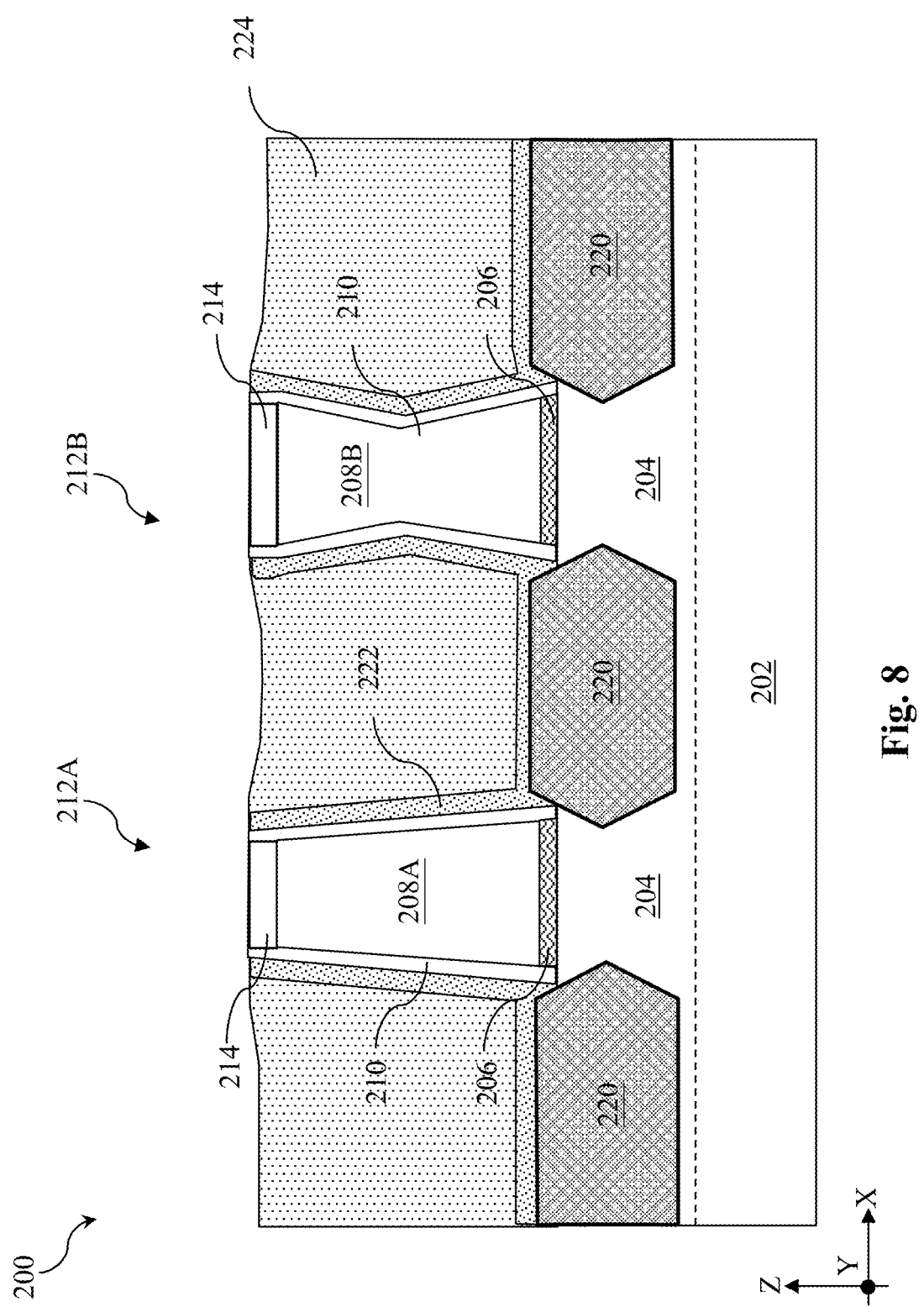

Referring to FIGS. 1 and 8, the method 100 includes a block 114 where the second gate-top hard mask 216 of the first dummy gate stack 212A and the second dummy gate stack 212B is etched back. In some embodiments, the second gate-top hard mask 216 may be etched back by a suitable dry etch or wet etch process. In embodiments where the second gate-top hard mask 216 is formed of silicon nitride and the first gate-top hard mask 214 is formed of silicon oxide, removal of the second gate-top hard mask 216 at block 114 ensures a top surface of the workpiece 200 that consists essentially of silicon oxide, thereby providing a uniform surface for subsequent processing.

Figure 9:
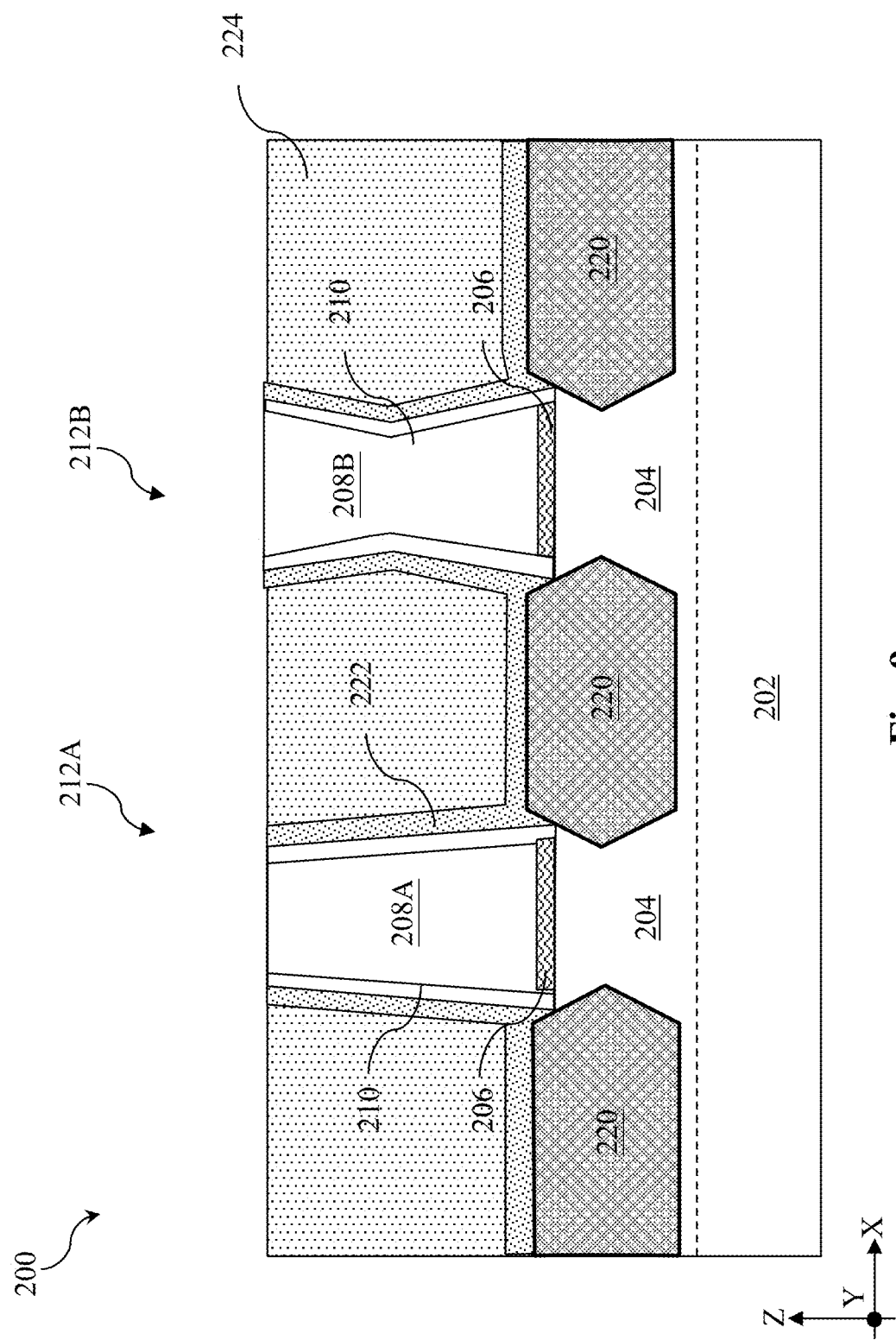

Referring to FIGS. 1 and 9, the method 100 includes a block 116 where the workpiece 200 is planarized. In some embodiments, after a top surface of a uniform composition is prepared at block 114, the workpiece 200 is planarized to expose the first dummy gate electrode 208A and the second dummy gate electrode 208B. The planarization at block 116 may be performed using a CMP process.

Figure 10:
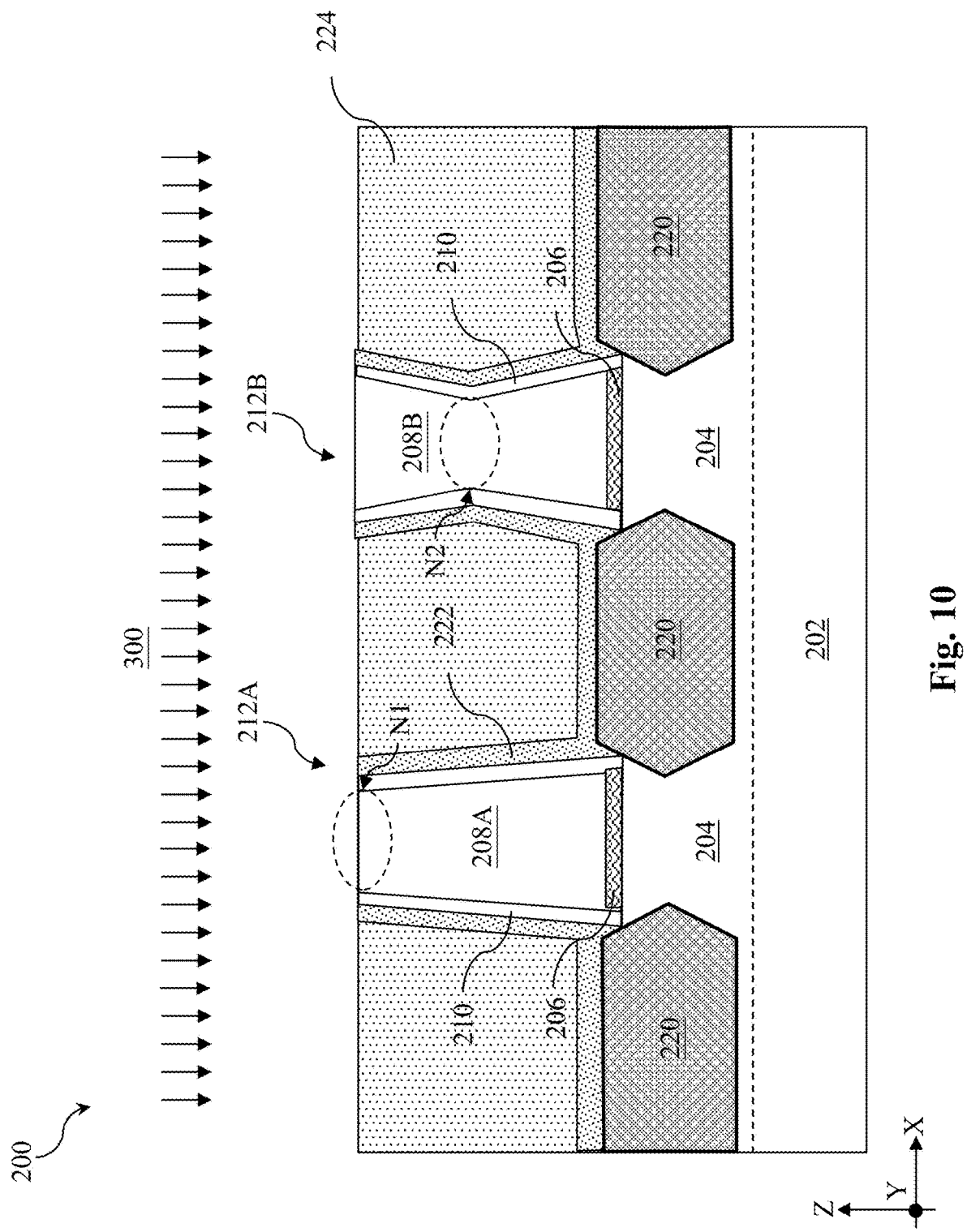

Referring to FIGS. 1 and 10, the method 100 includes a block 118 where the workpiece 200 is implanted in an implantation process 300 with a second semiconductor material. The second semiconductor material is different from the first semiconductor material. In some instances, the first semiconductor material includes silicon and the second semiconductor material includes germanium. In those instances, the first semiconductor material for the first dummy gate stack 212A and the second dummy gate stack 212B is free of germanium before the implantation operations at block 118. The implantation process 300 at block 118 may include an energy between about 5 keV and about 20 keV and a dose between about $1E+14$ ions/cm$^2$ and about $1E+16$ ions/cm$^2$. In some instances, the implantation at block 118 may amorphize the first dummy gate stack 212A and the second dummy gate stack 212B. In those instances, when the polysilicon in the first dummy gate stack 212A and the second dummy gate stack 212B is amorphized by the germanium implantation, a tensile stress may be exerted. As the implantation largely lands in upper portions of the first dummy gate stack 212A and the second dummy gate stack 212B, the aforementioned tensile stress is exerted on upper portions of the first dummy gate stack 212A and the second dummy gate stack 212B.

As the entire workpiece 200 is being implanted at block 118, the second semiconductor material, such as germanium, may be implanted not only into top portions of the first dummy gate electrode 208A and the second dummy gate electrode 208B, but also into top portions of the first dielectric layer 224, the etch stop layer 222, and the gate spacer layer 210. Upon conclusion of the operations at block 118, a germanium concentration profile along the Z direction may be present in each of the first dielectric layer 224, the etch stop layer 222, and the gate spacer layer 210. Because the second semiconductor material, such as germanium, has different diffusion coefficients in different materials, each of the first dielectric layer 224, the etch stop layer 222, and the gate spacer layer 210 will have a different concentration profile along the Z direction. In addition, the second semiconductor material, such as germanium may diffuse faster at an interface between two layers than in any layer. For example, the second semiconductor material may diffuse faster at the interface between the first dielectric layer 224 and the etch stop layer 222 and at the interface between the etch stop layer 222 and the gate spacer layer 210. In embodiments where the first dielectric layer 224 includes silicon oxide, the second semiconductor dopant implanted into the first dielectric layer 224 may be present in the form of nanoclusters or in the form of oxide. For example, when the second semiconductor material is germanium, upon conclusion of operations at block 118, germanium may be present in the first dielectric layer 224 in the form of nanoclusters or in the form of germanium oxide.

It is also observed that the reduced widths at the first necking portion N1 and the second necking portion N2 may result in increase in local concentrations of the second semiconductor material. In embodiments where the second semiconductor material is germanium, local germanium concentrations at the necking portions (i.e., the first necking portion N1 and the second necking portion N2) are higher than local concentrations outside the necking portions. That is, implantation at block 118 may result in Z-direction germanium concentration profiles that peak at the first necking portion N1 and the second necking portion N2.

Figure 11:
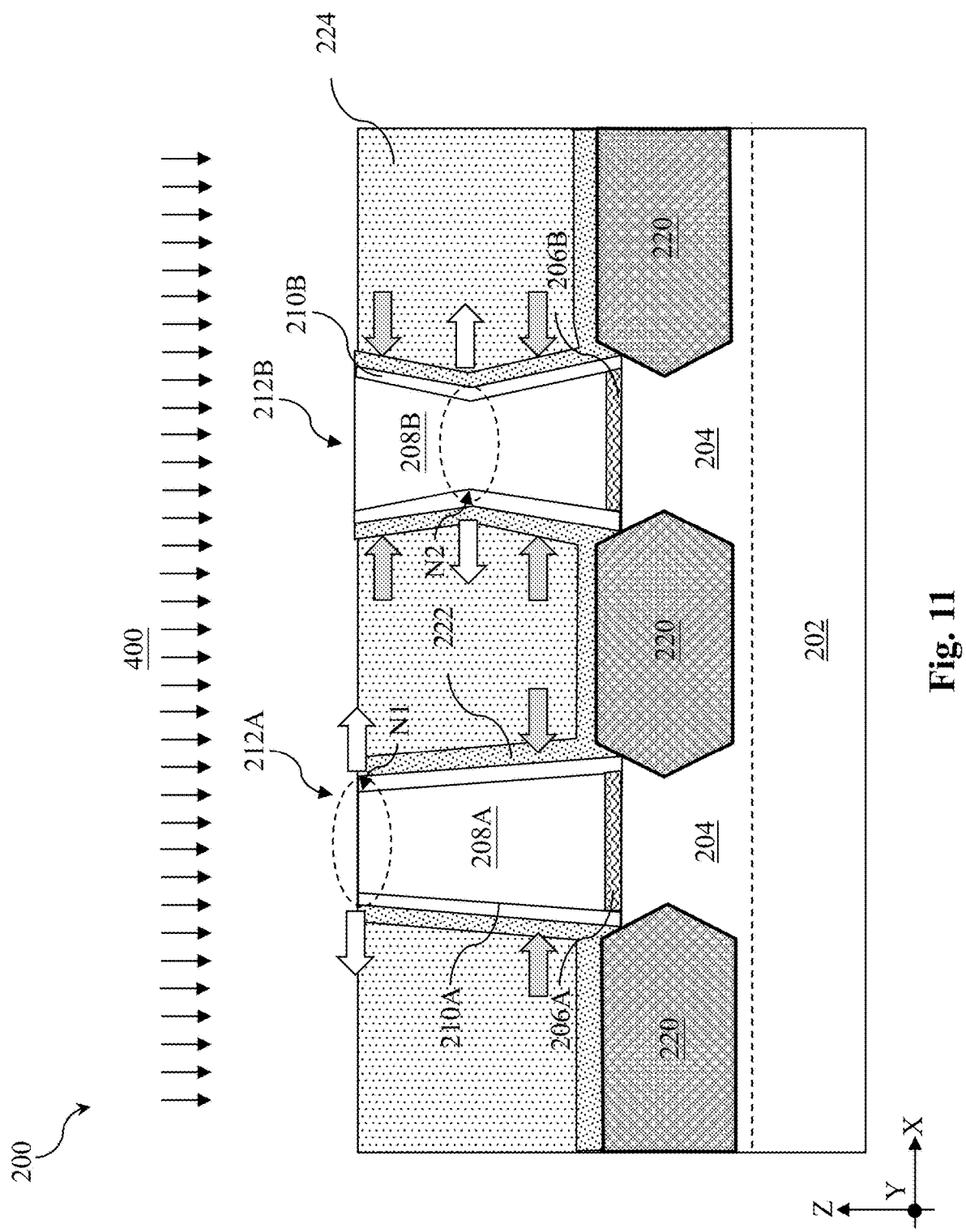

Referring to FIGS. 1 and 11, the method 100 includes a block 120 where the workpiece 200 is annealed using an anneal process 400. In some embodiments, the anneal process 400 is a microsecond annealing process with a peak anneal temperature between about 500° C. and about 650° C. The anneal process 400 may crystallize the first dummy gate stack 212A (or the first dummy gate electrode 208A, to be precise) and the second dummy gate stack 212B (or the second dummy gate electrode 208B, to be precise) to generate a compressive stress. At the same time, the higher germanium concentrations at the first necking portion N1 and the second necking portion N2 may nevertheless undergo a tensile stress due to lattice mismatch between the first semiconductor material and the second semiconductor material. The net stress distribution is illustrated in FIG. 11 by arrows. At the first necking portion N1 and the second necking portion N2, the tensile stress due to lattice mismatch surpasses the compressive stress and a net tensile stress is exerted on the first necking portion N1 and the second necking portion N2 to widen the necking portions. In regions outside the first necking portion N1 and the second necking portion N2, such as the upper portions or the lower portions shown in FIG. 2, a net compressive stress may be resulted to reduce widths outside the necking portions. It is observed that the gate spacer layer 210 and the etch stop layer 222 are compliant enough such that the foregoing compressive stress and tensile stress may operate to rectify the necking profiles of the first dummy gate stack 212A and the second dummy gate stack 212B. In some instances, the necking in the first dummy gate stack 212A and the second dummy gate stack 212B may be alleviated, yielding more upright sidewalls profiles.

As described above with respect to block 118, the second semiconductor material, such as germanium, may be implanted into top portions of the first dielectric layer 224, the etch stop layer 222, and the gate spacer layer 210. At block 120, the anneal process 400 may drive the second semiconductor material, such as germanium, further into the first dielectric layer 224, the etch stop layer 222, and the gate spacer layer 210. In some embodiments, because the peak anneal temperature of the anneal process 400 is insufficient to drive the second semiconductor material all the way through the depths of the first dielectric layer 224, the etch stop layer 222, and the gate spacer layer 210, concentrations of the second semiconductor material in the top portions (i.e., portions away from the substrate 202) of the first dielectric layer 224, the etch stop layer 222, and the gate spacer layer 210 are greater than concentrations in the bottom portions (i.e., portions closer the substrate 202) of the first dielectric layer 224, the etch stop layer 222, and the gate spacer layer 210. For avoidance of doubts, as used herein, a top portion is the portion above the mid-height-level of the respective feature and a bottom portion is the portion below the mid-height-level of the respective feature and a bottom portion.

Figure 12:
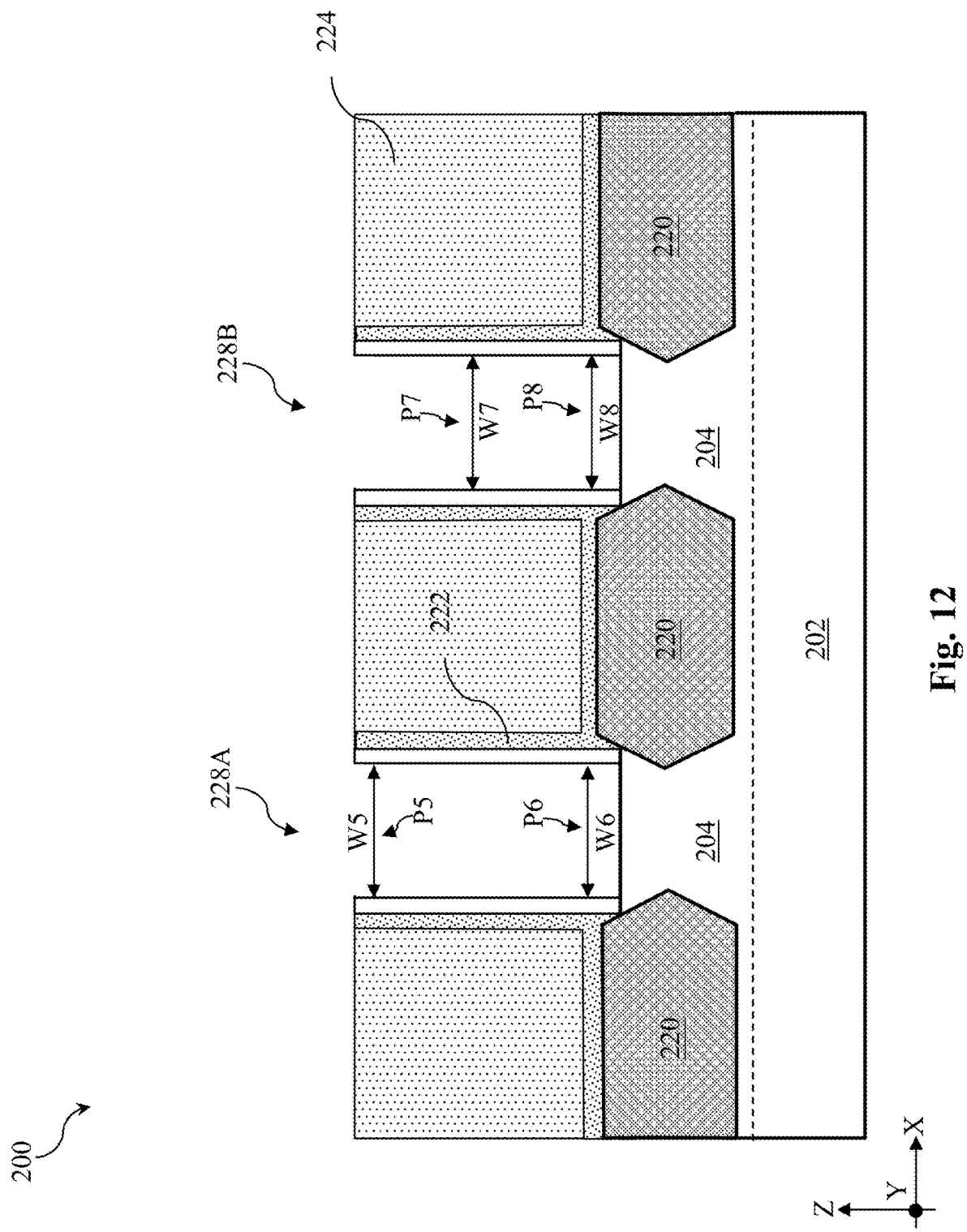

Referring to FIGS. 1 and 12, the method 100 includes a block 122 where the first dummy gate stack 212A and the second dummy gate stack 212B are removed to form a first gate trench 228A and a second gate trench 228B. In some embodiments, the first dummy gate stack 212A and the second dummy gate stack 212B may be removed using a combination of suitable dry etch processes and wet etch processes to form the first gate trench 228A and the second gate trench 228B. The first gate trench 228A and the second gate trench 228B expose channel regions of the active region 204. In embodiments represented in FIG. 12, operations at block 122 are performed after operations at blocks 118 and 120 which, as described above, rectifies the necking profiles of the first dummy gate stack 212A and the second dummy gate stack 212B. The profiles of the corresponding gate trenches (the first gate trench 228A and the second gate trench 228B) are rectified as well. As shown in FIG. 12, the first gate trench 228A includes a top portion P5 and a bottom portion P6 and the second gate trench 228B includes a mid portion P7 and a bottom portion P8. The top portion P5 of the first gate trench 228A includes a fifth width W5. The bottom portion P6 of the first gate trench 228A includes a sixth width W6. The mid portion P7 of the second gate trench 228B includes a seventh width W7. The bottom portion P8 of the second gate trench 228B includes an eighth width W8. In some embodiments, the sixth width W6 is greater than the fifth width W5 by a third difference (D3) and the eighth width W8 is greater than the seventh width W7 by a fourth difference (D4). Because the necking is alleviated, the third difference (D3) is smaller than the first difference (D1) and the fourth difference (D4) is smaller than the second difference (D2). That is, width difference between necking portions and non-necking portions is reduced by operations at blocks 118 and 120.

Figure 13:
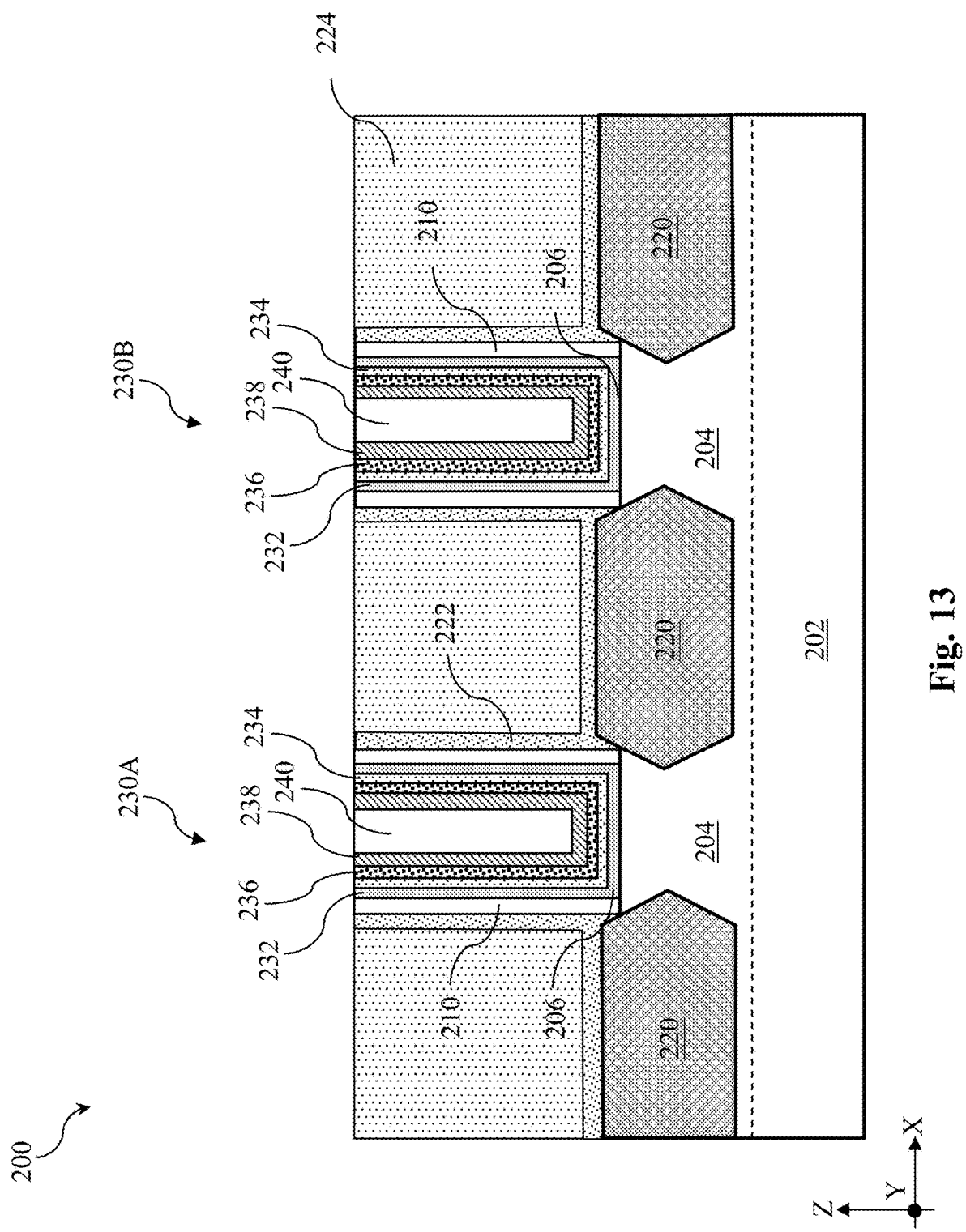

Referring to FIGS. 1 and 13, the method 100 includes a block 124 where a first metal gate stack 230A and a second metal gate stack 230B are formed in the first gate trench 228A and the second gate trench 228B. Each of the first metal gate stack 230A and the second metal gate stack 230B may include an interfacial layer, a high-k dielectric layer, work function metal layers, or a metal fill layer. In some embodiments represented in FIG. 13, each of the first metal gate stack 230A and the second metal gate stack 230B includes an interfacial layer 232, a high-k dielectric layer 234 over the interfacial layer 232, a first work function metal layer 236, a second work function metal layer 238, and a metal fill layer 240. In some implementations, the interfacial layer 232 may be formed of silicon oxide. The high-k dielectric layer 234 includes dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. In some instances, the first work function metal layer 236 may include a mid-gap material, such as titanium nitride. The second work function metal layer 238 may include an aluminum-containing material, such as titanium aluminum (TiAl), titanium aluminum carbide (TiAlC), tantalum aluminum (TaAl), tantalum aluminum carbide (TaAlC), titanium aluminum nitride (TiAlN), aluminum nitride (AlN), hafnium aluminum carbide (HfAlC), or hafnium aluminum nitride (HfAlN). The metal fill layer 240 may be formed of a metal, such as tungsten, ruthenium, aluminum, copper, or a combination thereof. In some embodiments, the first metal gate stack 230A and the second metal gate stack 230B may not include the metal fill layer 240.

Necking profiles in the first gate trench 228A and the second gate trench 228B may cause the second work function metal layer 238 to merge. Merging of the second work function metal layer 238 may result in voids within the second work function metal layer 238 or prevent deposition of the metal fill layer 240. It is observed that the merging of the second work function metal layer 238 may result in increase of threshold voltage and non-ideal operation of the semiconductor device 200. Operations at blocks 118 and 120 of the method 100 of the present disclosure may rectify the necking profiles and prevent merging of the second work function metal layer 238. Methods according to the present disclosure therefore can reduce device failure count and improve yield.

Referring to FIG. 1, the method 100 includes a block 126 where further processes are performed. Such further processes functionally connect transistors in the workpiece 200 to complete fabrication of the semiconductor device. Examples of such further processes may include formation of interlayer dielectric (ILD) layers, source/drain contacts, gate contacts, source/drain contact via, gate contact vias, power rails, and interconnect structures.

Methods according to the present disclosure provide a mechanism to rectify necking profiles of dummy gate stacks after the dummy gate stacks are formed. By implanting a semiconductor material different from that in the dummy gate stacks and annealing the implanted dummy gate stacks, stress may be generated to ameliorate the necking profile so as to form gate trenches with upright profiles that are conducive to forming the metal gate stacks. Methods according to the present disclosure reduce device fail count and improve yield.

The present disclosure provides embodiments of methods for forming semiconductor devices. In one embodiment, the present disclosure provides a method that includes forming, over a workpiece, a dummy gate stack comprising a first semiconductor material, depositing a first dielectric layer over the dummy gate stack using a first process, implanting the workpiece with a second semiconductor material different from the first semiconductor material, after the implanting, annealing the dummy gate stack, and replacing the dummy gate stack with a metal gate stack.

In some embodiments, the first semiconductor material includes silicon and the second semiconductor material includes germanium. In some implementations, the method further includes before the implanting, depositing a second dielectric layer over the first dielectric layer using a second process different from the first process, and planarizing the workpiece to expose the dummy gate stack. In some instances, the first process is a flowable chemical vapor deposition (FCVD) process and the second process is a plasma-enhanced chemical vapor deposition (PECVD) process. In some embodiments, the method further includes depositing a gate spacer layer over the dummy gate stack and the implanting of the workpiece implants the gate spacer layer and the first dielectric layer with the second semiconductor material. In some examples, the annealing comprises microsecond annealing. In some embodiments, the annealing includes a temperature between about 500° C. and about 650° C.

In another embodiment, the present disclosure provides a method that includes forming, over a workpiece, a dummy gate stack comprising silicon, forming a source/drain feature adjacent the dummy gate stack, depositing a first dielectric layer over the dummy gate stack using a first process, implanting the workpiece with germanium, after the implanting, annealing the dummy gate stack, removing the dummy gate stack to form a gate trench, and forming a metal gate stack in the gate trench.

In some embodiments, the source/drain feature includes dopants other than carbon and the source/drain feature is doped with carbon to prevent thermal diffusion of the dopants. In some implementations, the dummy gate stack includes a lower portion and an upper portion over the lower portion, a width of the lower portion is greater than a width of the upper portion by a first difference, the gate trench comprises a bottom portion and a top portion over the bottom portion, a width of the bottom portion is greater than a width of the top portion by a second difference, and the first difference is greater than the second difference. In some instances, the implanting causes a first germanium concentration in the upper portion and a second germanium concentration in the lower portion and the first germanium concentration is greater than the second germanium concentration. In some examples, the implanting causes a tensile stress on the upper portion. In some embodiments, the annealing causes a tensile stress on the upper portion and a compressive stress on the lower portion. In some instances, the annealing includes microsecond annealing. In some examples, the annealing includes a temperature between about 500° C. and about 650° C.

In yet another embodiment, the present disclosure provides a semiconductor device that includes an active region, a gate structure disposed over the active region, an etch stop layer disposed over sidewalls of the gate structure, and a dielectric layer disposed over the etch stop layer. The dielectric layer includes germanium.

In some embodiments, the etch stop layer includes germanium. In some implementations, the semiconductor device further includes a gate spacer layer disposed between the etch stop layer and the gate structure and the gate spacer layer includes germanium. In some instances, the dielectric layer interfaces the etch stop layer at an interface and germanium is present at the interface. In some embodiments, the dielectric layer includes a top portion and a bottom portion and a germanium concentration in the top portion is greater than a germanium concentration in the bottom portion.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a dummy gate stack over a channel region of an active region, the dummy gate stack comprising:
   a dummy electrode, and
   a spacer layer disposed along sidewalls of the dummy electrode;
   forming a source/drain feature over a source/drain region of the active region;
   depositing a contact etch stop layer (CESL) over the dummy gate stack, sidewalls of the spacer layer and the source/drain feature;
   depositing a dielectric layer over the CESL;
   planarizing the dielectric layer to expose the spacer layer and the dummy electrode;
   after the planarizing, implanting a semiconductor species into the dielectric layer, the spacer layer and the dummy electrode;
   after the implanting, annealing the dummy electrode; and
   after the annealing, replacing the dummy gate stack with a metal gate stack,
   wherein the metal gate stack comprises titanium aluminum.

2. The method of claim 1, wherein the active region comprises a fin-shaped semiconductor feature or a vertical stack of semiconductor nanostructures.

3. The method of claim 1, wherein the dummy electrode comprises a necking portion.

4. The method of claim 3, wherein, after the implanting, a concentration at the necking portion is greater than a concentration at portions of the dummy electrode outside of the necking portion.

5. The method of claim 4, wherein, during the annealing, the concentration at the necking portion causes a tensile stress to widen the necking portion.

6. The method of claim 1, wherein the dummy electrode comprises polysilicon.

7. The method of claim 1, wherein the semiconductor species comprises silicon germanium (SiGe).

8. The method of claim 1, wherein the annealing comprises a microsecond annealing process.

9. The method of claim 8, wherein the microsecond annealing process comprises a peak anneal temperature between about 500° C. and about 650° C.

10. The method of claim 1, wherein the implanting comprises an ion energy between about 5 keV and about 20 keV.

11. The method of claim 1, wherein the implanting comprises a dose between about $1\times10^{14}$ ions/cm$^2$ and about $1\times10^{16}$ ions/cm$^2$.

12. A method, comprising:
    forming a dummy gate stack over a channel region of an active region, the dummy gate stack comprising:
    a dummy electrode comprising a first semiconductor material and a necking portion, and
    a spacer layer disposed along sidewalls of the dummy electrode;
    forming a source/drain feature over a source/drain region of the active region;
    depositing a contact etch stop layer (CESL) to interface a sidewall of the spacer layer and a top surface of the source/drain feature;
    depositing a dielectric layer over the CESL;
    planarizing the dielectric layer to expose the spacer layer and the dummy electrode;
    after the planarizing, implanting a second semiconductor material into the dielectric layer, the spacer layer and the dummy electrode;
    after the implanting, annealing the dummy electrode to widen the necking portion; and
    after the annealing, replacing the dummy gate stack with a metal gate stack.

13. The method of claim 12, wherein the first semiconductor material and the second semiconductor material have a lattice mismatch.

14. The method of claim 12, wherein the first semiconductor material comprises silicon, wherein the second semiconductor material comprises silicon germanium.

15. The method of claim 12, wherein the metal gate stack comprises titanium aluminum.

16. The method of claim 12, wherein the annealing comprises a microsecond annealing process.

17. The method of claim 12, wherein the implanting comprises an ion energy between about 5 keV and about 20 keV.

18. A method, comprising:
   forming a dummy gate stack over a channel region of an active region, the dummy gate stack comprising:
      a dummy electrode comprising polysilicon and a necking portion, and
      a spacer layer disposed along sidewalls of the dummy electrode;
   forming a source/drain feature over a source/drain region of the active region;
   depositing a contact etch stop layer (CESL) to interface a sidewall of the spacer layer and a top surface of the source/drain feature;
   depositing a dielectric layer over the CESL;
   planarizing the dielectric layer to expose the spacer layer and the dummy electrode;
   after the planarizing, implanting germanium into the dielectric layer, the spacer layer and the dummy electrode;
   after the implanting, annealing the dummy electrode to widen the necking portion; and
   after the annealing, replacing the dummy gate stack with a metal gate stack,
   wherein the metal gate stack comprises titanium aluminum.

19. The method of claim 18, wherein the active region comprises a fin-shaped semiconductor feature or a vertical stack of semiconductor nanostructures.

20. The method of claim 18,
   wherein the annealing comprises a microsecond annealing process,
   wherein the microsecond annealing process comprises a peak anneal temperature between about 500° C. and about 650° C.

* * * * *